United States Patent
Kim et al.

(10) Patent No.: US 9,983,617 B2
(45) Date of Patent: May 29, 2018

(54) INTEGRATED CIRCUIT AND COMPUTING DEVICE HAVING THE SAME

(71) Applicant: Samsung Electronics Co., Ltd., Suwon-si, Gyeonggi-do (KR)

(72) Inventors: Je Kook Kim, Yongin-si (KR); Chan Woo Park, Anyang-si (KR); Min Shik Seok, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 37 days.

(21) Appl. No.: 15/057,380

(22) Filed: Mar. 1, 2016

(65) Prior Publication Data
US 2016/0327975 A1 Nov. 10, 2016

(30) Foreign Application Priority Data
May 6, 2015 (KR) .......................... 10-2015-0062980

(51) Int. Cl.
*G06F 1/00* (2006.01)
*G06F 1/12* (2006.01)
*H03K 5/15* (2006.01)

(52) U.S. Cl.
CPC ........... *G06F 1/12* (2013.01); *H03K 5/15013* (2013.01)

(58) Field of Classification Search
CPC .............................. G06F 1/12; H03K 5/15013
See application file for complete search history.

(56) References Cited

U.S. PATENT DOCUMENTS

| 5,243,572 A | 9/1993 | Hoshizaki et al. |
| 6,586,971 B1 | 7/2003 | Naffziger et al. |
| 6,922,111 B2 | 7/2005 | Kurd et al. |
| 6,922,112 B2 | 7/2005 | Kurd et al. |
| 6,934,872 B2 | 8/2005 | Wong et al. |
| 6,943,502 B2 | 9/2005 | Lee |
| 7,133,751 B2 | 11/2006 | Kurd et al. |
| 7,218,166 B2 | 5/2007 | Lutkemeyer |
| 7,225,349 B2 | 5/2007 | Tam et al. |
| 7,295,938 B2 | 11/2007 | Nakashiba et al. |
| 7,345,460 B2 | 3/2008 | Ma et al. |
| 7,409,568 B2 | 8/2008 | Tam et al. |
| 7,528,619 B2 | 5/2009 | Paillet et al. |
| 7,755,405 B2 | 7/2010 | Yun et al. |
| 7,782,141 B2 | 8/2010 | Witmer et al. |
| 8,060,766 B2 | 11/2011 | Konstadinidis et al. |
| 8,497,694 B2 | 7/2013 | Chua-Eoan et al. |

(Continued)

FOREIGN PATENT DOCUMENTS

KR 101183738 B1 9/2012

*Primary Examiner* — Austin Hicks
(74) *Attorney, Agent, or Firm* — Harness, Dickey & Pierce, P.L.C.

(57) ABSTRACT

An integrated circuit configured to detect a variation in a supply voltage using a phase of an input clock signal dependent on the variation in the supply voltage may include a clock delay circuit configured to delay the input clock signal output from a clock generator using each of different delay cell chains and generate a first delay clock signal and a second delay clock signal; and a phase controller configured to control a first phase so that a difference between the first phase and a second phase is 180 degrees, the first phase being a phase of the first delay clock signal, the second phase being a phase of the second delay clock signal.

19 Claims, 11 Drawing Sheets

(56) References Cited

U.S. PATENT DOCUMENTS

| | | | |
|---|---|---|---|
| 8,587,357 | B2 | 11/2013 | Kim et al. |
| 8,604,862 | B2 | 12/2013 | Turullols et al. |
| 8,627,160 | B2 | 1/2014 | Devta-Prasanna et al. |
| 8,648,645 | B2 | 2/2014 | Konstadinidis et al. |
| 8,669,794 | B2 | 3/2014 | Park et al. |
| 2004/0046597 | A1* | 3/2004 | Alon ............... H03K 3/037 327/278 |
| 2009/0115486 | A1* | 5/2009 | Na .................. G06F 1/06 327/295 |
| 2009/0315600 | A1* | 12/2009 | Becker ............ H03L 7/0814 327/158 |
| 2012/0187991 | A1 | 7/2012 | Sathe et al. |
| 2013/0285696 | A1 | 10/2013 | Chua-Eoan et al. |
| 2014/0081474 | A1 | 3/2014 | Blakeley et al. |
| 2014/0264734 | A1 | 9/2014 | Abdelmoneum et al. |

* cited by examiner

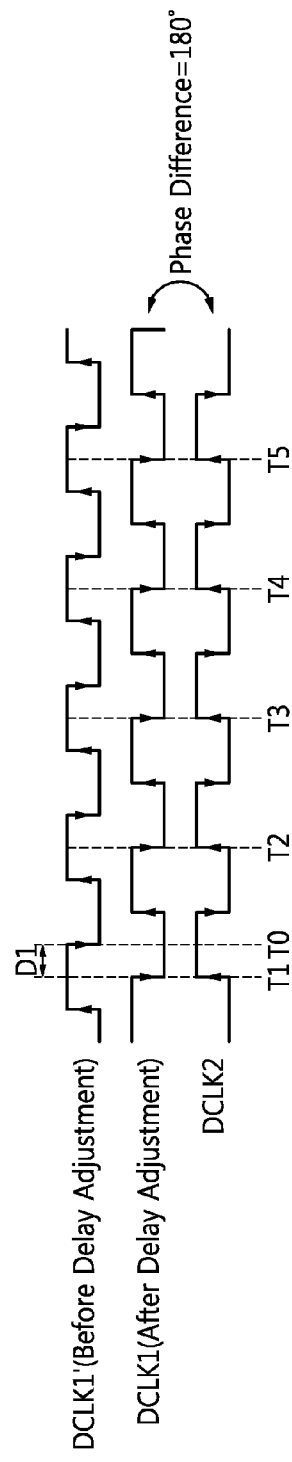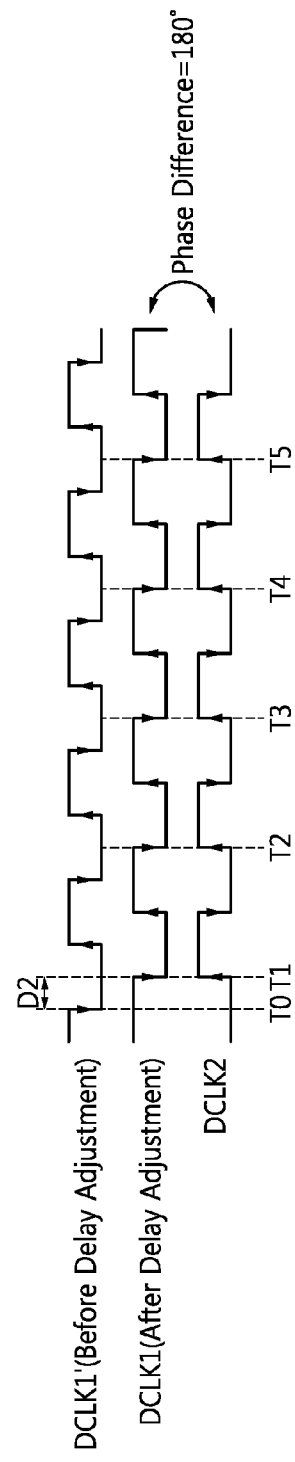

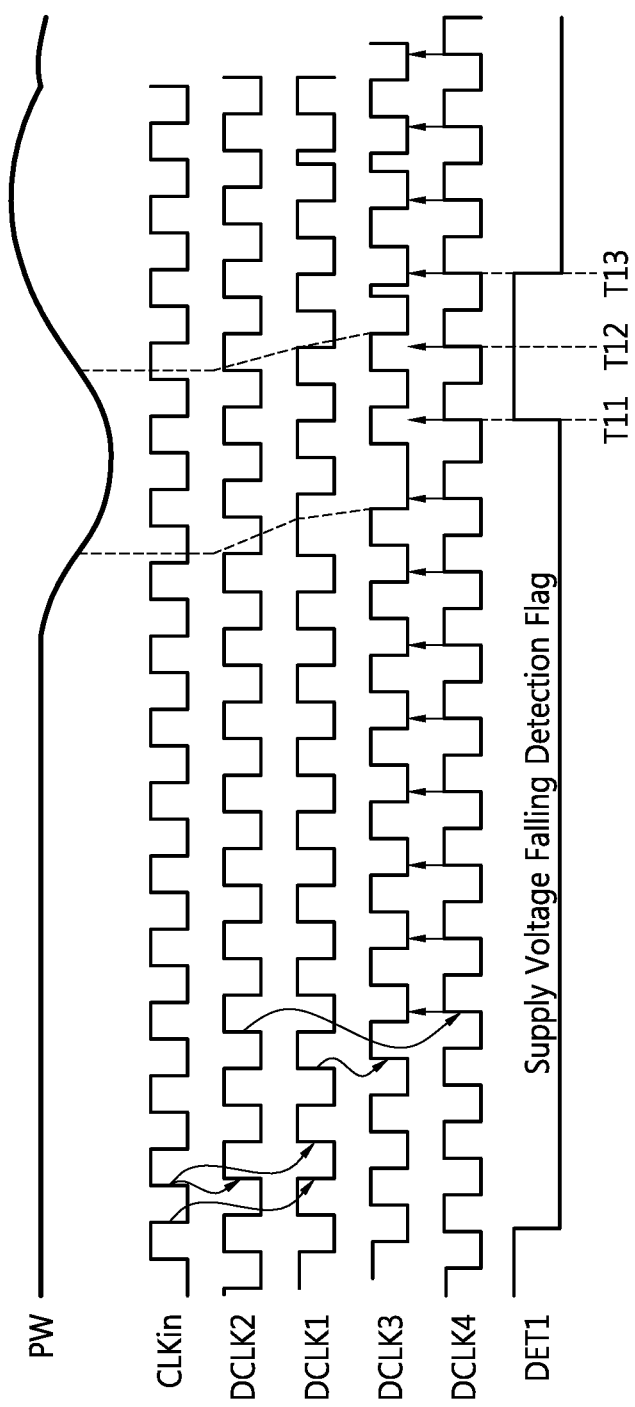

INTEGRATED CIRCUIT AND COMPUTING DEVICE HAVING THE SAME

CROSS-REFERENCE TO RELATED APPLICATION

This application claims priority under 35 U.S.C. § 119 from Korean Patent Application No. 10-2015-0062980 filed on May 6, 2015 in the Korean Intellectual Property Office (KIPO), the entire disclosure of which is incorporated herein by reference.

BACKGROUND

1. Field

At least some example embodiments of the inventive concepts relate to an integrated circuit, and more particularly, to an integrated circuit which detects a variation in a supply voltage using a phase of a clock signal dependent on the variation in a supply voltage supplied to the integrated circuit, and a computing device having the same.

2. Related Art

A system on chip (SoC) is a technology-intensive semiconductor technology which embodies a complicated system having various functions of the related art in one system. The SoC may include a processor which generally controls the SoC and various peripheral circuits which are controlled by the processor. The peripheral circuits may each be, for example, a circuit which can be integrated into a SoC, a logic circuit, and/or a combination of these. Moreover, the circuit or the logic circuit may store a code.

In general, since at least some electronic systems which include a SoC having various peripheral circuits operate by a battery, a low power design may be employed. When a reference clock signal output from a phase locked loop (PLL) or a crystal oscillator is supplied to a SoC, each of a plurality of peripheral circuits may use each of clock signals generated based on the reference clock signal as an operation clock signal.

However, when a significant (e.g., relatively large and/or computationally intense) load occurs in a SoC, a temporary voltage droop may occur in a supply voltage supplied to the SoC or each peripheral circuit, and when the voltage droop occurs, the SoC or each peripheral circuit may malfunction.

SUMMARY

According to at least some example embodiments of the inventive concepts, an integrated circuit configured to detect a variation in a supply voltage using a phase of an input clock signal dependent on the variation in the supply voltage includes a clock delay circuit configured to delay the input clock signal output from a clock generator using each of different delay cell chains and generate a first delay clock signal and a second delay clock signal; and a phase controller configured to control a first phase so that a difference between the first phase and a second phase is 180 degrees, the first phase being a phase of the first delay clock signal, the second phase being a phase of the second delay clock signal.

The phase controller may include a comparison signal generator configured to sample the first delay clock signal using the second delay clock signal, and generate a comparison signal according to a result of the sampling; and an up/down counter configured to generate a first phase control code for controlling the first phase based on the comparison signal and an inverted version of the input clock signal.

The up/down counter may be configured to, determine whether to perform an up count operation or a down count operation according to a level of the comparison signal, perform a determined count operation using the inverted clock signal, and generate the first phase control code.

The clock delay circuit may include a first delay cell chain configured to change a phase of the input clock signal based on the first phase control code and generate the first delay clock signal having the first phase; and a second delay cell chain configured to change a phase of the input clock signal based on a set value and generate the second delay clock signal having the second phase.

The integrated circuit may further include a detection circuit configured to generate a third delay clock signal by delaying the first delay clock signal, generate a fourth delay clock signal by delaying the second delay clock signal, and output a detection signal that indicates the detection of a variation direction of the supply voltage based on a difference between a third phase of the third delay clock signal and a fourth phase of the fourth delay clock signal.

The integrated circuit may further include a clock phase adjuster configured to generate a transmission control signal in response to the detection signal, wherein the clock generator controls a transmission timing of the input clock signal based on the transmission control signal.

The detection circuit may sample the third delay clock signal using the fourth delay clock signal, and generate the detection signal which indicates that the supply voltage has fallen.

The detection circuit may include a first delay cell chain configured to delay a phase of the first delay clock signal based on a set value and generate the third delay clock signal having the third phase; a second delay cell chain configured to delay a phase of the second delay clock signal based on a second phase control code and generate the fourth delay clock signal having the fourth phase; and a detection signal generator configured to sample the third delay clock signal using the fourth delay clock signal and generate the detection signal.

The detection circuit may sample the fourth delay clock signal using the third delay clock signal, and generate the detection signal which indicates that the supply voltage has risen.

The integrated circuit may further include a first delay cell chain configured to delay a phase of the first delay clock signal based on a second phase control code and generate the third delay clock signal having the third phase; a second delay cell chain configured to delay a phase of the second delay clock signal based on a set value and generate the fourth delay clock signal having the fourth phase; and a detection signal generator configured to sample the fourth delay clock signal using the third delay clock signal and generate the detection signal.

The integrated circuit may further include a first delay cell chain configured to delay the first delay clock signal based on a set value and generate a third delay clock signal; a second delay cell chain configured to delay a phase of the second delay clock signal based on a second phase control code and generate a fourth delay clock signal; a third delay cell chain configured to delay a phase of the first delay clock signal based on the second phase control code and generate a fifth delay clock signal; a fourth delay cell chain configured to delay the second delay clock signal based on a set value and generate a sixth delay clock signal; a first detection signal generator configured to sample the third delay clock signal using the fourth delay clock signal and generate a first detection signal that indicates the supply voltage has fallen; and a second detection signal generator configured to sample the sixth delay clock signal using the fifth delay clock signal and generate a second detection signal that indicates the supply voltage has risen.

The integrated circuit may further include a clock phase adjuster configured to generate a transmission control signal in response to the first detection signal or the second detection signal, wherein the clock generator controls a transmission timing of the input clock signal based on the transmission control signal.

According to at least some example embodiments of the inventive concepts, a computing device includes a power management integrated circuit (IC); and an integrated circuit configured to detect a variation in a supply voltage using a phase of an input clock signal dependent on the variation in a supply voltage PW output from the power management IC, wherein the integrated circuit includes, a clock generator configured to generate the input clock signal; a clock delay circuit configured to delay the input clock signal output from the clock generator using each of different delay cell chains and generate a first delay clock signal and a second delay clock signal; and a phase controller configured to control a first phase so that a difference between the first phase and a second phase is 180 degrees, the first phase being a phase of the first delay clock signal, the second phase being a phase of the second delay clock signal.

The phase controller may include a comparison signal generator configured to sample the first delay clock signal using the second delay clock signal and generate a comparison signal according to a result of the sampling; and a up/down counter configured to generate a first phase control code for controlling the first phase based on the comparison signal and an inverted version of the input clock signal.

The up/down counter may be configured to, determine whether to perform an up count operation or a down count operation according to a level of the comparison signal, perform a determined count operation using the inverted clock signal, and generate the first phase control code.

According to at least some example embodiments, a computing device includes a clock signal control circuit configured to output an output clock signal; and a function circuit configured to operate based on the output clock signal, the clock signal control circuit being further configured to, generate an input clock signal, generate a first delay clock signal having a first phase by delaying the input clock signal, generate a second delay clock signal having a second phase by delaying the input clock signal, generate a third delay clock signal having a third phase by delaying the first delay clock signal, generate a fourth delay clock signal having a fourth phase by delaying the second delay clock signal, generate a first detection signal by sampling the third delay clock signal based on the fourth delay clock signal, the first detection signal indicating whether or not a supply voltage of the clock signal control circuit has fallen, generate a first adjusted clock signal by adjusting the input clock signal based on the first detection signal indicating the supply voltage has fallen, and output to the function circuit, as the output clock signal, the first adjusted clock signal.

The clock signal control circuit may be configured to generate the first delay clock signal and the second delay clock signal such that a phase difference between the first phase and the second phase is 180°.

The output clock signal may control a timing of operations of the function circuit.

The clock signal control circuit may be configured to, generate a fifth delay clock signal having a fifth phase by delaying the first delay clock signal, generate a sixth delay clock signal having a sixth phase by delaying the second delay clock signal, generate a second detection signal by sampling the sixth delay clock signal based on the fifth delay clock signal, the second detection signal indicating whether or not a supply voltage of the clock signal control circuit has risen, generate a second adjusted input clock signal by adjusting the input clock signal based on the second detection signal indicating the supply voltage has risen, and output to the function circuit, as the output clock signal, the second adjusted input clock signal.

The clock signal control circuit may be configured to generate the first delay clock signal and the second delay clock signal such that a phase difference between the first phase and the second phase is 180°.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 6A is a timing diagram which describes at least one example embodiment of an operation of a phase controller shown in FIG. 1;

FIG. 6B is a timing diagram which describes at least another example embodiment of the operation of the phase controller shown in FIG. 1;

FIG. 7 is a timing diagram which describes an operation of a first detection circuit shown in FIG. 2;

DETAILED DESCRIPTION OF THE PREFERRED EMBODIMENTS

Figure 1:
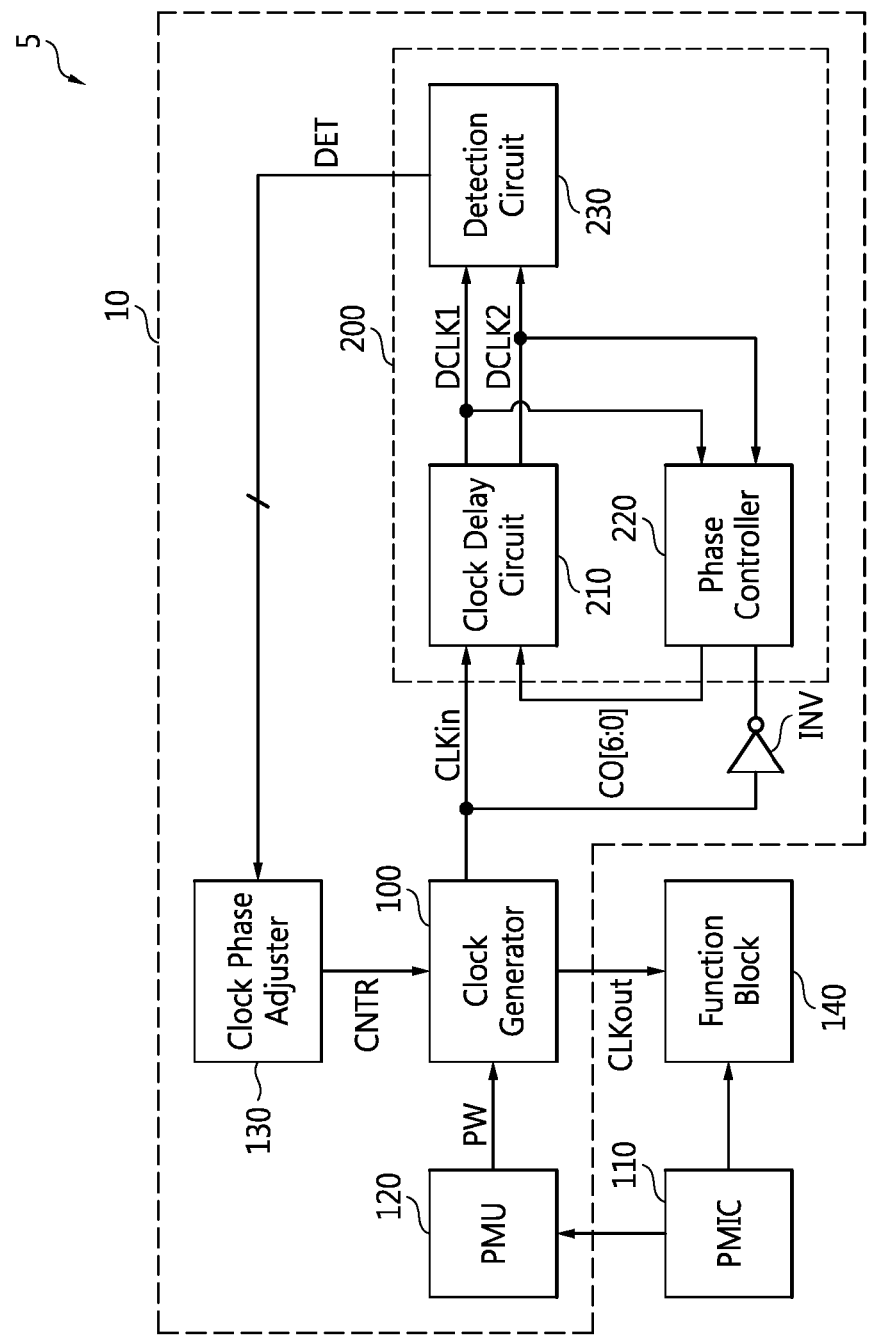
FIG. 1 is a schematic block diagram of a computing device according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
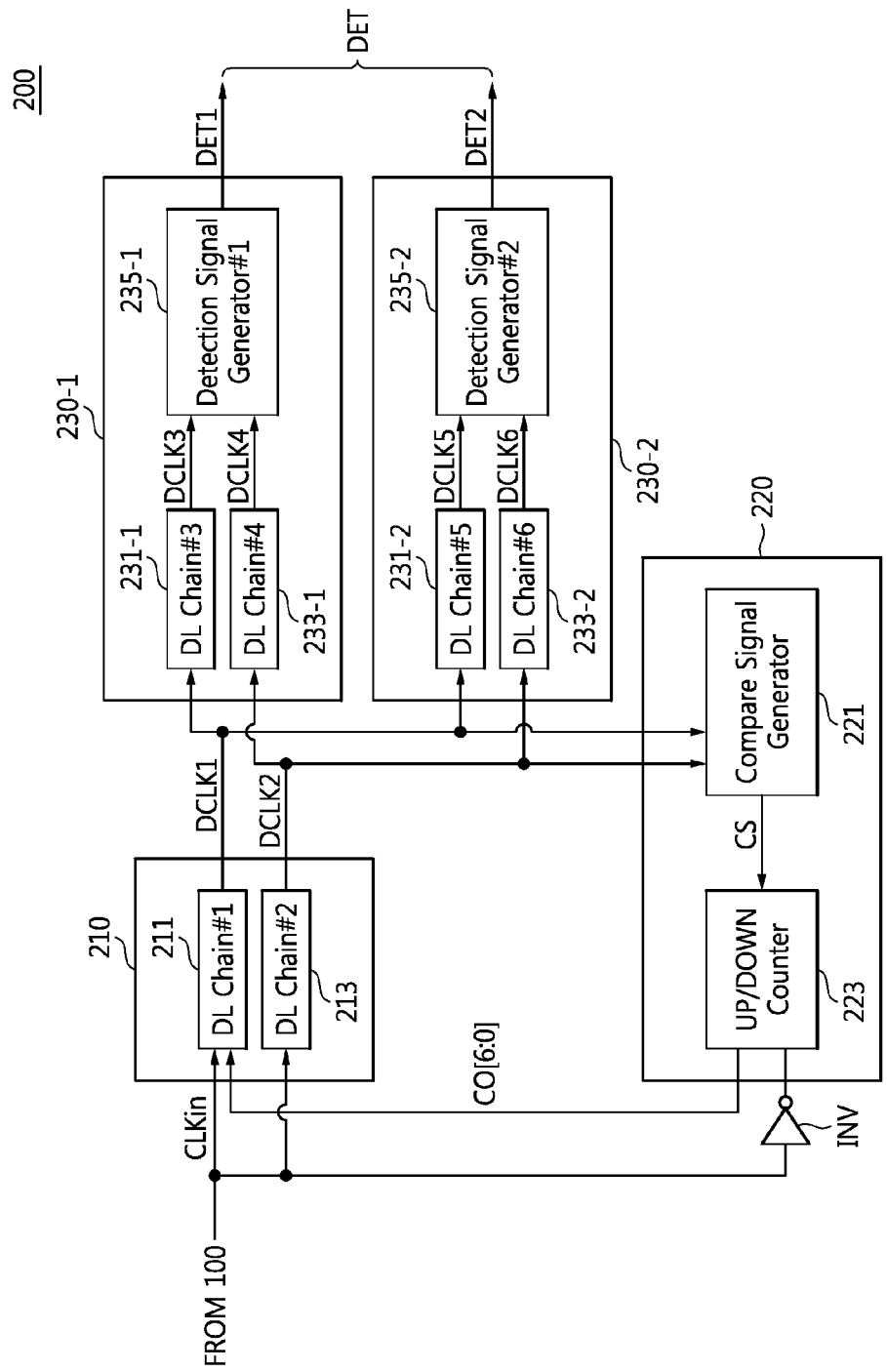
FIG. 2 is a schematic block diagram of a clock control circuit shown in FIG. 1.

FIG. 1 is a schematic block diagram of a computing device 5 according to at least one example embodiment of the present inventive concepts, and FIG. 2 is a schematic block diagram of a clock control circuit shown in FIG. 1. Referring to FIG. 1, a computing device 5 may include a clock control device 10, a function block 140, and a power management integrated circuit (PMIC) 110. According to at least one example embodiment of the inventive concepts, the clock control device 10 may be a clock signal control circuit implemented as a circuit or circuitry. The computing device 5 may be embodied in and/or by an electronic device, e.g., a personal computer (PC) or a mobile computing device, which uses a clock signal CLKin.

Examples of the above-referenced mobile computing device include, but are not limited to, a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile internet device (MID), a wearable computer, an internet of things (IoT) device, an internet of everything (IoE) device, or an e-book.

The clock control device 10 may detect a variation in a supply voltage PW using a phase of a clock signal CLKin dependent on the variation in a supply voltage PW. For example, the clock control device 10 may be embodied in and/or by an integrated circuit, a system on chip (SoC), or a chip set, but is not limited to these examples. The PMC 110 may supply an operation voltage to the clock control device 10 and the function block 140.

The clock control device 10 may include the following, each of which may be implemented, for example, by a circuit or circuitry: a clock generator 100, a power management unit (PMU) 120, a clock phase adjuster 130, a function block 140, and a clock control circuit 200.

When a supply voltage PW generated by the PMU 120 is supplied to the clock generator 100, the clock generator 100 may generate a clock signal CLKin. For example, the clock generator 100 may be embodied in a phase locked loop (PLL), a delayed locked loop (DLL), or a crystal oscillator; however, it is not limited thereto.

The clock generator 100 may control a supplying (or transmitting) timing of a clock signal CLKout supplied (or transmitted) to the function block 140 in response to a transmission control signal CNTR transmitted from the clock phase adjuster 130. According to at least some example embodiments of the inventive concepts, a timing of one or more functions performed by the function block 140 is controlled by the clock signal CLKout.

The PMIC 110 may supply an operation voltage to the clock control device 10 (e.g., via the PMU 120) and the function block 140. According to at least some example embodiments of the inventive concepts, the operation voltage supplied by the PMIC 110 may be an operation voltage of the computing device 5 (and thus, an operation voltage, or the basis thereof, for some or all components of the computing device 5, including, for example, the function block 140 and clock control circuit 200). The PMU 120 may manage an operation voltage supplied from the PMIC 110, and manage supply voltages used in the clock control device 10. The PMU 120 may supply a supply voltage PW to the clock generator 100 based on the operation voltage supplied form the PMIC 110.

The clock phase adjuster 130 may generate a transmission control signal CNTR for controlling a transmission timing of the clock signal CLKout in response to a detection signal DET output from the clock control circuit 200.

The function block 140 may include a processor and various electronic circuits which are controlled by the processor. The electronic circuit may include a central processing unit (CPU), each of a plurality of cores included in the CPU, a graphics processing unit (GPU), a multi-format codec (MFC), a video module (for example, a camera interface, a joint photographic experts group (JPEG) processor, a video processor, or a mixer), an audio system, a driver, a display driver, a volatile memory device, a non-volatile memory device, a memory controller, a cache memory, a serial port, a system timer, a watch dog timer, an analog-to-digital converter, and/or a digital-to-analog converter. Thus, according to at least some example embodiments of the inventive concepts, the function block 140 may be a function circuit.

The function block 140 may include a plurality of electronic circuits, and each of the plurality of electronic circuits may use a clock signal having a different clock frequency. At this time, the clock signal CLKout may be one or more clock signals.

The clock control circuit 200 may detect a variation in a supply voltage PW using a phase of a clock signal CLKin dependent on the variation in a supply voltage PW.

Referring to FIGS. 1 and 2, the clock control circuit 200 may include a clock delay circuit 210, a phase controller 220, and a detection circuit 230. The phase controller 220 may be implemented by, for example circuits or circuitry. The detection circuit 230 may include a first detection circuit 230-1 and a second detection circuit 230-2.

The clock delay circuit 210 may receive a clock signal CLKin output from the clock generator 100, delay the clock signal CLKin using each of different delay cell chains 211 and 213, and generate a first delay clock signal DCLK1 and a second delay clock signal DCLK2.

The clock delay circuit 210 may transmit the first delay clock signal DCLK1 and the second delay clock signal DCLK2 to the phase controller 220, a first detection circuit 230-1, and a second detection circuit 230-2.

The clock delay circuit 210 may include a first delay cell chain 211 and a second delay cell chain 213. The first delay cell chain 211 may delay the clock signal CLKin using first delay cells (DL11 to DL17 of FIG. 3) which are connected to a first phase control code CO[6:0] in series, and generate a first delay clock signal DCLK1. The second delay cell chain 213 may delay the clock signal CLKin using second delay cells (DL21 to DL27 of FIG. 3) which are connected to a second phase control code in series, and generate a second delay clock signal DCLK2.

According to at least one example embodiment, the first delay cells DL11 to DL17 may be connected to each other in series, and the second delay cells (DL21 to DL27 of FIG. 3) may be connected to each other in series. According to at least some example embodiments of the inventive concepts, each of the first delay cells (DL11 to DL17 of FIG. 3) and each of the second delay cells (DL21 to DL27 of FIG. 3) may be embodied as, for example, one or more of a buffer, an inverter, or an element generating a delay. Additionally, at least one example structure for the delay cells DL11 to DL17 and DL21 to DL27 of FIG. 3 will be discussed in greater detail below with reference to FIG. 5.

Figure 3:
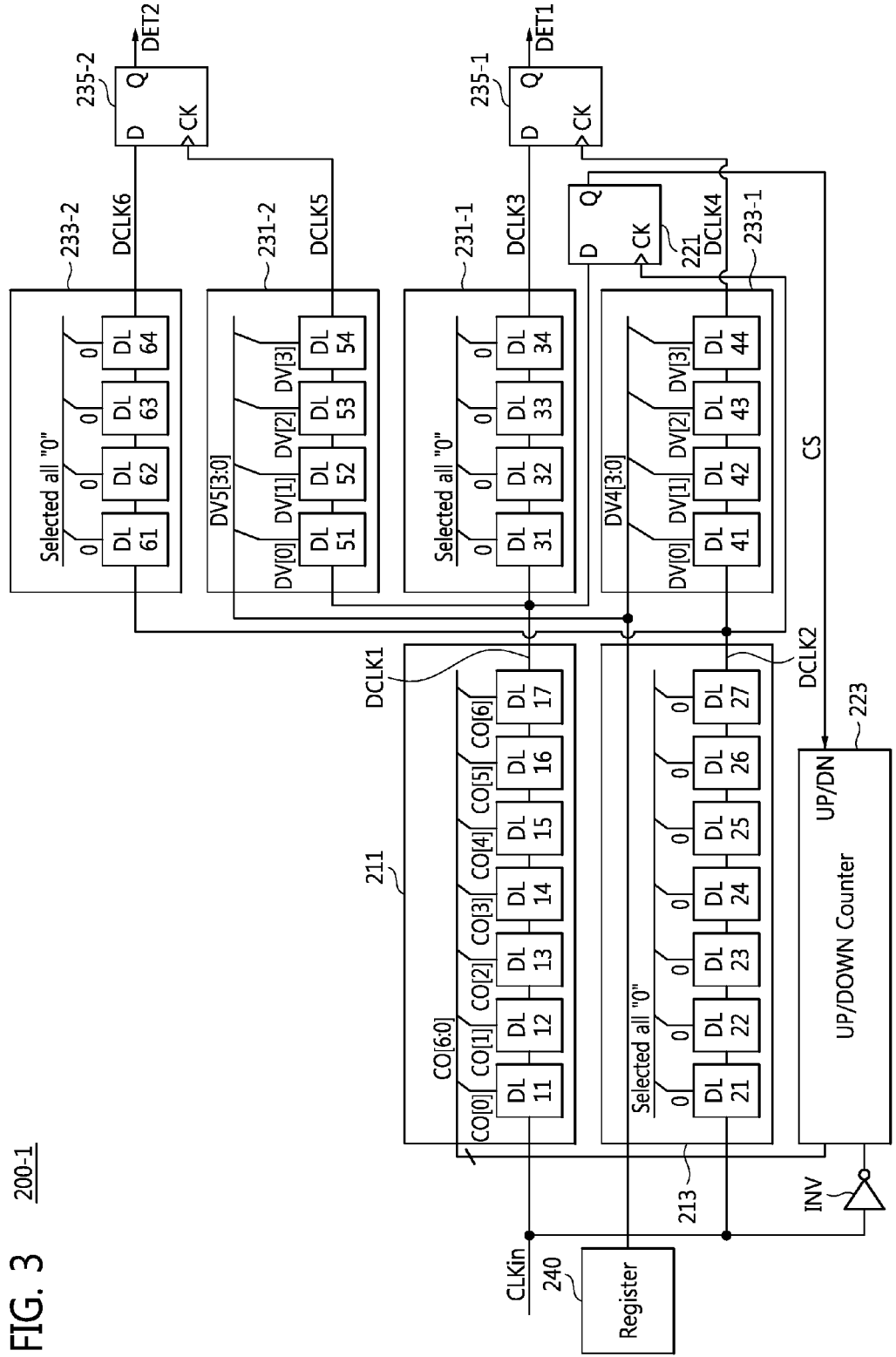
FIG. 3 is a block diagram which shows at least one example embodiment of the clock control circuit shown in FIG. 2.

The first phase control code CO[6:0] is transmitted (fedback) to the first delay cell chain 211 from the phase controller 220, and controls whether or not to activate a delay function of each of the first delay cells DL11 to DL17 of FIG. 3. For example, as will be discussed in greater detail below with reference to FIG. 5, according to at least one example embodiment of the inventive concepts, a delay function of a delay cell may be activated when a value of a control code (e.g., control code CO[6:0]) corresponding to the delay cell is "1" such that the amount of delay applied by a delay cell to a received signal may be greater when a value of a control code (e.g., control code CO[6:0]) corresponding to the delay cell is "1" than when the value of the control code corresponding to the delay cell is "0." Thus, according to at least one example embodiment of the inventive concepts, a delay provided by a delay cell chain may increase as a number of "1" values included in a phase control code corresponding to the delay cell chain increases. For example, each of bits CO[0] to CO[6] may be logic 1 or logic 0. For example, when each of the bits CO[0] to CO[6] is logic 1, a delay of the first delay cell chain 211 may be increased or, alternatively, maximized, and when each of the bits CO[0] to CO[6] is logic 0, the delay of the first delay cell chain 211 may be reduced or, alternatively, minimized.

The second phase control code may be a code set in advance in each of the second delay cells DL21 to DL27 of FIG. 3. The second phase control code may control whether or not to activate a delay function of each of the second delay cells DL21 to DL27 of FIG. 3. As shown in FIG. 3, the second phase control code may be set as a code having logic 0. According to at least one example embodiment, the first phase control code CO[6:0] may be a variable code and the second phase control code may be a value set during a power-up sequence of the computing device 5, and may be set according to a register value set by a user.

The phase controller 220 may include a comparison signal generator 221 and an up/down counter 223, each of which may be implemented by, for example circuits or circuitry.

The comparison signal generator 221 may receive a first delay clock signal DCLK1 output from the first delay cell chain 211, and receive a second delay clock signal DCLK2 output from the second delay cell chain 213.

The comparison signal generator 221 may compare a phase of the first delay clock signal DCLK1 and a phase of the second delay clock signal DCLK2 and generate a comparison signal CS according to a result of the comparison. According to at least one example embodiment, the comparison signal generator 221 may sample the first delay clock signal DCLK1 using the second delay clock signal DCLK2 and generate a comparison signal CS according to a result of the sampling. For example, a level of the comparison signal CS may be logic 0 or logic 1. An example manner in which the comparison signal CS may be generated will be discussed in greater detail below with reference to FIG. 3.

The up/down counter 223 may perform an up count operation or a down count operation in response to the comparison signal CS and an inverted clock signal, and generate a first phase control code CO[6:0] according to a result of the up count operation. At this time, the first phase control code CO[6:0] may control a phase of the first delay clock signal DCLK1 so that a difference between a phase of the first delay clock signal DCLK1 and a phase of the second delay clock signal DCLK2 is 180 degrees. For example, the control code CO[6:0] may control an amount of delay applied by the first delay chain 221 by selectively controlling a total number of delay cells whose delay functions are activated, such that a greater delay is applied by the first delay chain 221 when the delay functions of a greater number of delay cells of the first delay chain 221 are activated. An inverter INV may invert a clock signal CLKin and transmit an inverted clock signal to the up/down counter 223.

According to at least one example embodiment, the up/down counter 223 may determine whether to perform an up count operation or a down count operation according to the comparison signal CS, perform a determined count operation based on an inverted clock signal, and generate a first phase control code CO[6:0] corresponding to a result of the count operation.

The detection circuit 230 may generate delay clock signals DCLK3 and DCLK5 of a third group by delaying the first delay clock signal DCLK1, generate delay clock signals DCLK4 and DCLK6 of a second group by delaying the second delay clock signal DCLK2, generate detection signals DET1 and DET2 which detect a variation in a supply voltage PW based on differences between phases of the delay clock signals DCLK3 and DCLK5 of a first group and phases of the delay clock signals DCLK4 and DCLK6 of a second group, and output the detection signals DET1 and DET2 to the clock phase adjuster 130.

A first detection circuit 230-1 may include a third delay cell chain 231-1, a fourth delay cell chain 233-1, and a first detection signal generator 235-1.

A third delay cell chain 231-1 may delay the first delay clock signal DCLK1 using a third phase control code and third delay cells DL31 to DL34 of FIG. 3, and generate a third delay clock signal DCLK3.

A fourth delay cell chain 233-1 may delay the second delay clock signal DCLK2 using a fourth phase control code and fourth delay cells DL41 to DL44 of FIG. 3, and generate a fourth delay clock signal DCLK4.

According to at least one example embodiment, the third delay cells (DL31 to DL34 of FIG. 3) may be connected to each other in series, and the fourth delay cells (DL41 to DL44 of FIG. 3) may be connected to each other in series. According to at least some example embodiments of the inventive concepts, each of the third delay cells (DL31 to DL34 of FIG. 3) and each of the fourth delay cells (DL41 to DL44 of FIG. 3) may be embodied in a buffer, an inverter, or an element generating a delay. Additionally, at least one example structure for the delay cells DL31 to DL34 and DL41 to DL44 of FIG. 3 will be discussed in greater detail below with reference to FIG. 5.

The third phase control code may be a code set in advance in each of the third delay cells DL31 to DL34 of FIG. 3 as a code determined in advance. The third phase control code may control whether or not to activate a delay function of each of the third delay cells DL31 to DL34 of FIG. 3. The fourth phase control code may control whether or not to activate a delay function of each of the fourth delay cells DL41 to DL44 of FIG. 3 as a code set in each of the fourth delay cells DL41 to DL44 of FIG. 3. A detection range of a fall in a supply voltage PW performed by the first detection signal generator 235-1 may be determined according to values of bits included in the fourth phase control code.

According to at least one example embodiment, the fourth phase control code may be a variable code, and the third phase control code may be a value set during a power-up sequence of the computing device 5, and may be set according to a register value set by a user.

The first detection signal generator 235-1 may receive a third delay clock signal DCLK3 output from the third delay cell chain 231-1 and a fourth delay clock signal DCLK4 output from the fourth delay cell chain 233-1, and generate a first detection signal DET1 which represents a fall in a supply voltage PW based on a difference between a phase of the third delay clock signal DCLK3 and a phase of the fourth delay clock signal DCLK4. The first detection signal generator 235-1 may transmit the first detection signal DET1 to the clock phase adjuster 130. For example, the first detection signal generator 235-1 may sample the third delay clock signal DCLK3 using the fourth delay clock signal DCLK4, and generate the first detection signal DET1. The second detection circuit 230-2 may include a fifth delay cell chain 231-2, a sixth delay cell chain 233-2, and a second detection signal generator 235-2.

The fifth delay cell chain 231-2 may delay the first delay clock signal DCLK1 using a fifth phase control code and fifth delay cells (DL51 to DL54 of FIG. 3), and generate a fifth delay clock signal DCLK5. The sixth delay cell chain 233-2 may delay the second delay clock signal DCLK2 using a sixth phase control code and sixth delay cells (DL61 to DL64 of FIG. 3), and generate a sixth delay clock signal DCLK6. Additionally, at least one example structure for the delay cells DL51 to DL54 and DL61 to DL64 of FIG. 3 will be discussed in greater detail below with reference to FIG. 5.

According to at least one example embodiment, the fifth delay cells (DL51 to DL54 of FIG. 3) may be connected to each other in series, and the sixth delay cells (DL61 to DL64 of FIG. 3) may be connected to each other in series. According to at least some example embodiments of the inventive concepts, each of the fifth delay cells (DL51 to DL54 of FIG. 3) and each of the sixth delay cells (DL61 to DL64 of FIG. 3) may be embodied in a buffer, an inverter, or an element generating a delay.

The fifth phase control code may control whether or not to delay each of the fifth delay cells (DL51 to DL54 of FIG. 3) as a code set in each of the fifth delay cells (DL51 to DL54 of FIG. 3). A detection range of a rise in a supply voltage PW performed by the second detection signal generator 235-2 may be determined according to values of bits included in the fifth phase control code.

The sixth phase control code may be a code set in advance in each of the sixth delay cells (DL61 to DL64 of FIG. 3) as a code determined in advance. The sixth phase control code may control whether or not to delay each of the sixth delay cells (DL61 to DL64 of FIG. 3). According to at least one example embodiment, the fifth phase control code may be a variable code, and the sixth phase control code may be a value set during a power-up sequence of the computing device 5, and may be set according to a register value set by a user.

The second detection signal generator 235-2 may receive the fifth delay clock signal DCLK5 output from the fifth delay cell chain 231-5 and the sixth delay clock signal DCLK6 output from the sixth delay cell chain 233-6, and generate a second detection signal DET2 which shows a rise in the supply voltage PW based on a difference between a phase of the fifth delay clock signal DCLK5 and a phase of the sixth delay clock signal DCLK6. The second detection signal generator 235-2 may transmit the second detection signal DET2 to the clock phase adjuster 130. For example, the second detection signal generator 235-2 may sample the sixth delay clock signal DCLK6 using the fifth delay clock signal DCLK5, and generate the second detection signal DET2.

Figure 4:
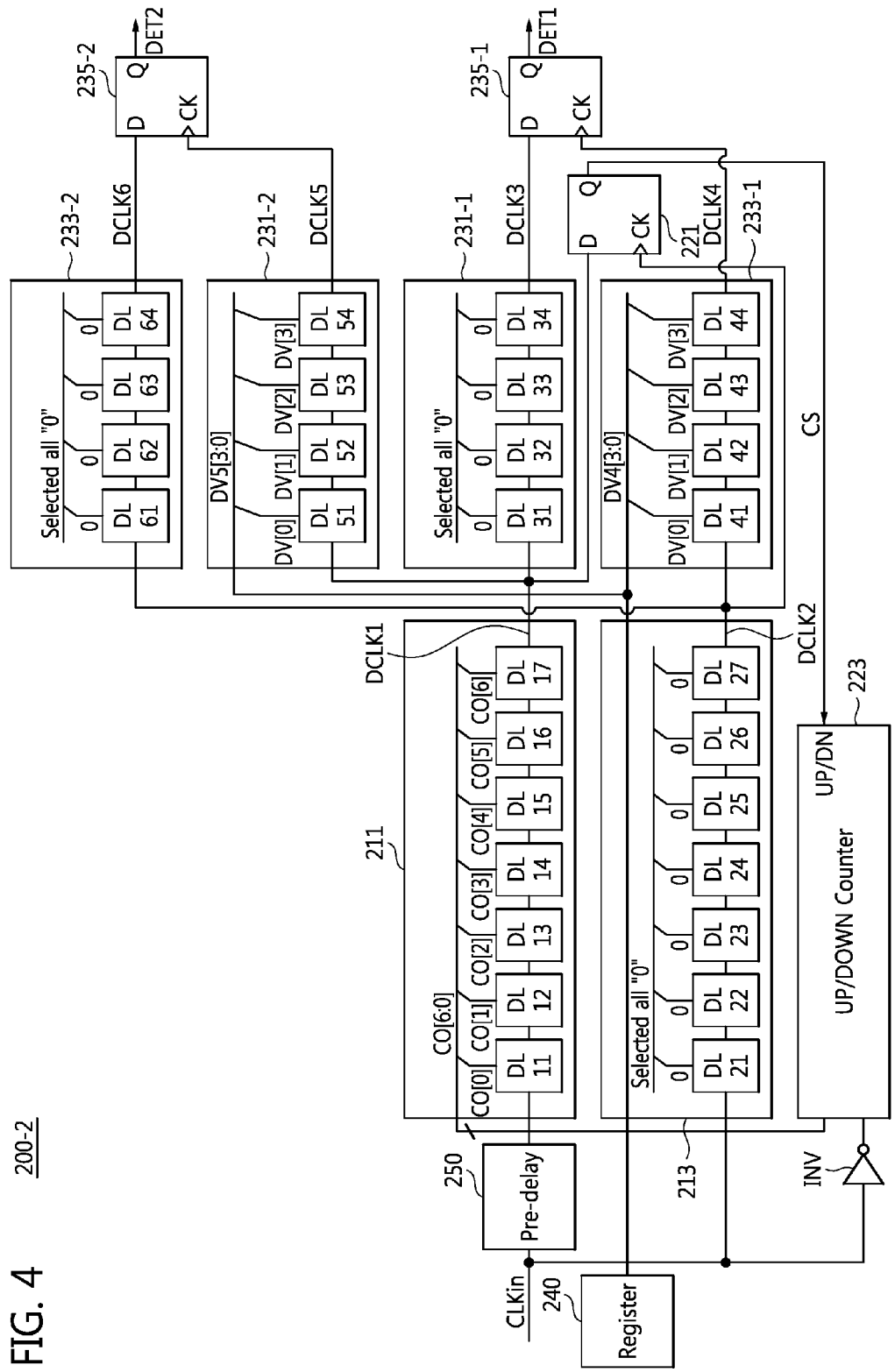
FIG. 4 is a block diagram which shows at least another example embodiment of the clock control circuit shown in FIG. 2.

FIG. 3 is a block diagram which shows at least one example embodiment of the clock control circuit shown in FIG. 2, and FIG. 4 is a block diagram which shows at least another example embodiment of the clock control circuit shown in FIG. 2.

Referring to FIGS. 1 to 3, the first delay cell chain 211 may include the first delay cells DL11 to DL17 connected to each other in series, the second delay cell chain 213 may include the second delay cells DL21 to DL27 connected to each other in series, the third delay cell chain 231-1 may include the third delay cells DL31 to DL34 connected to each other in series, the fourth delay cell chain 233-1 may include the fourth delay cells DL41 to DL44 connected to each other in series, the fifth delay cell chain 231-2 may include the fifth delay cells DL51 to DL54 connected to each other in series, and the sixth delay cell chain 233-2 may include the sixth delay cells DL61 to DL64 connected to each other in series.

The magnitude of delay applied to received signals may vary between first delay cells DL11 to DL17, the magnitude of delay applied to received signals may vary between second delay cells DL21 to DL27, the magnitude of delay applied to received signals may vary between third delay cells DL31 to DL34, the magnitude of delay applied to received signals may vary between fourth delay cells DL41 to DL44, the magnitude of delay applied to received signals may vary between fifth delay cells DL51 to DL54, and the magnitude of delay applied to received signals may vary between sixth delay cells DL61 to DL64. For example, each delay of the first delay cells DL11 to DL17 may be determined by a weighted value.

The first delay cell chain 211 may be the same or, alternatively, substantially the same as the second delay cell chain 213 in structure, the third delay cell chain 231-1 may be the same or, alternatively, substantially the same as the fourth delay cell chain 233-1 in structure, and the fifth delay cell chain 231-2 may be the same or, alternatively, substantially the same as the sixth delay cell chain 233-2 in structure.

Even if each of the delay cell chains 211, 213, 231-1, 233-1, 231-2, and 233-2 includes delay cells as many as shown in FIG. 3; however, the number of delay cells included in each of the delay cell chains 211, 213, 231-1, 233-1, 231-2, and 233-2 may be variously changed according to a design specification.

Each of the comparison signal generator 221, the first detection signal generator 235-1, and the second detection signal generator 235-2 may be embodied, for example, as a D-flip-flop.

The first delay cell chain 211 may determine whether or not to delay each of the first delay cells DL11 to DL17 based on the first phase control code CO[6:0], and generate the first delay clock signal DCLK1.

The second delay cell chain 213 may determine whether or not to delay each of the second delay cells DL21 to DL27 based on the second phase control code, and generate the second delay clock signal DCLK2. For example, when bits included in the second phase control code are set to logic 0, a delay of a clock signal CLKin may be reduced or, alternatively, minimized. The reduced or, alternatively, minimized delay may be a delay determined according to physical properties of each of the delay cells DL21 to DL27 included in the second delay cell chain 213. For example, when each of the delay cells DL21 to DL27 is embodied in a delay cell shown in FIG. 5, the reduced or, alternatively, minimized delay may be determined according to a delay of a multiplexer included in each of the delay cells DL21 to DL27, as will be discussed in greater detail below with reference to FIG. 5.

The comparison signal generator 221 may receive a first delay clock signal DCLK1 output from the first delay cell chain 211 through an input terminal D, receive a second delay clock signal DCLK2 output from the second delay cell chain 213 through a clock terminal CK, and output a comparison signal CS to the up/down counter 223 through an output terminal Q.

The comparison signal generator 221 may sample a level of the first delay clock signal DCLK1 using a sampling edge (e.g., a rising edge or a falling edge) of the second delay clock signal DCLK2 and generate a comparison signal CS according to a result of the sampling. For example, when the value of the first delay clock signal DCLK1 sampled at a rising edge of the second delay clock signal DCLK2 is logic 0, the comparison signal generator 221 may generate a comparison signal CS having logic 0, and when the value of the first delay clock signal DCLK1 sampled at a rising edge of the second delay clock signal DCLK2 is logic 1, the comparison signal generator 221 may generate a comparison signal CS having logic 1.

According to at least one example embodiment, the up/down counter 223 may generate a first phase control code CD[6:0] for increasing a delay of the first delay clock signal DCLK1 in response to the comparison signal CS having logic 0. However, the up/down counter 223 may generate a first phase control code CO[6:0] for decreasing a delay of the first delay clock signal DCLK1 in response to the comparison signal CS having logic 1.

The third delay cell chain 231-1 may determine whether or not to delay each of the third delay cells DL31 to DL34 based on a third phase control code, and generate the third delay clock signal DCLK3. For example, the third phase control code may be a code for reducing or, alternatively, minimizing a delay of the first delay clock signal DCLK1.

The fourth delay cell chain 233-1 may determine whether or not to delay each of the fourth delay cells DL41 to DL44 based on a fourth phase control code DV4[3:0], and generate the fourth delay clock signal DCLK4. The fourth phase control code DV4[3:0] may be output from the register 240, and a detection range of a fall in a supply voltage PW performed by the first detection signal generator 235-1 may be determined according to values of bits included in the fourth phase control code DV4[3:0]. According to at least one example embodiment of the inventive concepts, a manufacturer and/or user of the computing device 5 may set the fourth phase control code DV4[3:0] stored in the register 240 in accordance with a desired detection range.

The first detection signal generator 235-1 may receive the third delay clock signal DCLK3 output from the third delay cell chain 231-1 through the input terminal D, receive the fourth delay clock signal DCKL4 output from the fourth delay cell chain 233-1 through the clock terminal CK, and output the first detection signal DET1 through the output terminal Q.

The first detection signal generator 235-1 may generate the first detection signal DET1 having a different level according to a level of the third delay clock signal DCLK3 sampled at a sampling edge of the fourth delay clock signal DCLK4.

For example, the first detection signal generator 235-1 may generate the first detection signal DET1 having logic 0 which indicates that a supply voltage PW did not fall (or the supply voltage PW is maintained within a given range) when the value of the third delay clock signal DCLK3 sampled at a rising edge of the fourth delay clock signal DCLK4 is logic 0. However, the first detection signal generator 235-1 may also generate a first detection signal DET1 having logic 1 which indicates that the supply voltage PW falls when the value of the third delay clock signal DCLK3 sampled at a rising edge of the fourth delay clock signal DCLK4 is logic 1.

The fifth delay cell chain 231-2 may determine whether or not to delay each of the fifth delay cells DL51 to DL54 based on a fifth phase control code DV5[3:0], and generate the fifth delay clock signal DCLK5. The fifth phase control code DV5[3:0] may be output from the register 240, and a detection range of a rise in a supply voltage PW by the second detection signal generator 235-2 may be determined according to values of bits included in the fifth phase control code DV5[3:0]. As is noted above, according to at least one example embodiment of the inventive concepts, a manufacturer and/or user of the computing device 5 may set the fifth phase control code DV5[3:0] stored in the register 240 in accordance with a desired detection range.

The sixth delay cell chain 233-2 may determine whether or not to delay each of the sixth delay cells DL61 to DL64 based on a sixth phase control code, and generate the sixth delay clock signal DCLK6. The sixth phase control code may be a code for reducing or, alternatively, minimizing a delay of the second delay clock signal DCLK2.

The second detection signal generator 235-2 may receive the sixth delay clock signal DCLK6 output from the sixth delay cell chain 233-2 through the input terminal D, receive the fifth delay clock signal DCLK5 output from the fifth delay cell chain 231-2 through the clock terminal CK, and output the second detection signal DET2 through the output terminal Q.

For example, the second detection signal generator 235-2 may generate the second detection signal DET2 having a different level according to a level of the sixth delay clock signal DCKL6 sampled at a sampling edge of the fifth delay clock signal DCLK5.

According to at least one example embodiment, the second detection signal generator 235-2 may generate a second detection signal DET2 having logic 0 which indicates that a supply voltage PW did not rise (or the supply voltage PW is maintained in a given range) when the value of the sixth delay clock signal DCLK6 sampled at a rising edge of the fifth delay clock signal DCLK5 is logic 0. Further, the second detection signal generator 235-2 may generate a second detection signal DET2 having logic 1 which indicates a rise in the supply voltage PW when the value of the sixth delay clock signal DCLK6 sampled at a rising edge of the fifth delay clock signal DCLK5 is logic 1.

Referring to FIGS. 1 to 4, except that the clock control circuit 200-2 of FIG. 4 further includes a pre-delay circuit 250, the clock control circuit 200-2 of FIG. 4 is that same as or, alternatively, substantially the same as the clock control circuit 200-1 of FIG. 3 in structure and operation.

When the clock signal CLKin is transmitted to the first delay cell chain 211, the pre-delay circuit 250 may delay the clock signal CLKin in advance to improve a phase margin of the clock signal CLKin. For example, the pre-delay circuit 250 may delay the clock signal CLKin in advance to such a degree that the first delay cell chain 211 is capable delaying the first delay clock signal DCLK1 to have a difference in phase of 180 degrees with respect to the second delay clock signal DCLK2 in response to the first phase control code CO[6:0].

Figure 5:
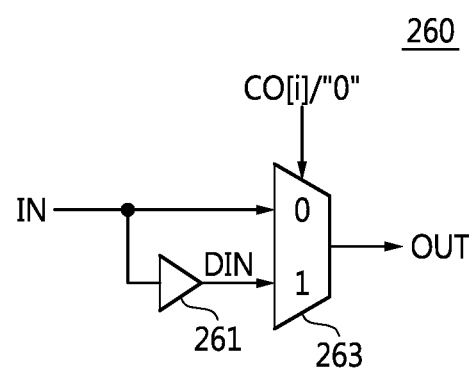
FIG. 5 is at least one example embodiment of a delay cell shown in FIG. 3 or 4.

FIG. 5 is at least one example embodiment of a delay cell shown in FIG. 3 or 4. Referring to FIGS. 3 to 5, each delay cell included in each of the delay cell chains 211, 213, 231-1, 233-1, 231-2, and 233-2 may be embodied as for example, the delay cell 260 of FIG. 5. Thus, the term delay cell chain refers to a chain of linked delay cells including, for example, delay cells having the structure of delay cell 260. For example, according to at least one example embodiment of the inventive concepts, a delay cell chain may include a plurality of delay cells 260 connected in series such that, for each delay cell 260 in the delay cell chain (except a last delay cell 260 in the delay cell chain), an output of the delay cell 260 is connected to an input of a next delay cell 260 in the delay cell chain.

The delay cell 260 may include a buffer 261 and a multiplexer 263. The delay cell 260 may output an input signal IN or an output signal DIN of the buffer 261 as an output signal OUT in response to a phase control code CO. A delay of the each delay cell may be determined according to a delay amount of the buffer 261. For example, a delay of a delay cell DL12 may be set to be larger than a delay of a delay cell DL11, a delay of a delay cell DL13 may be set to be larger than the delay of a delay cell DL12, and a delay of a delay cell DL17 may be set to be larger than a delay of a delay cell DL16.

The multiplexer 263 of each of all delay cells included in each of the delay cell chains 213, 231-1, and 233-2 may output an input signal IN as an output signal OUT in response to a selection signal having logic 0. At this time, a phase of the output signal OUT may be delayed more than a phase of the input signal IN according to a delay of the multiplexer 263 itself.

FIG. 6A is a timing diagram which describes at least one example embodiment of an operation of a phase controller shown in FIG. 1, and FIG. 6B is a timing diagram which describes at least another example embodiment of the operation of the phase controller shown in FIG. 1.

Referring to FIGS. 1 to 6A, the phase controller 220 may generate a first phase control code CO[6:0] using a first delay clock signal DCLK1' (before a phase adjustment) that is output from the clock delay circuit 210 and the second delay clock signal DCLK2. The first delay cell chain 211 may decrease a phase delay of the first delay clock signal DCLK1' based on the first phase control code CO[6:0] so that a difference between a phase of the second delay clock signal DCLK2 and a phase of the first delay clock signal DCLK1 is 180 degrees.

At each of the time T1 to T5, that is, when the first delay clock signal DCLK1' sampled at a rising edge of the second delay clock signal DCLK2 is logic 1, the phase controller 220 may generate the first phase control code CO[6:0] for adjusting a phase of the first delay clock signal DCLK1' as much as a first difference D1. The clock delay circuit 210 may adjust a phase of the first delay clock signal DCLK1' so as to have a difference of 180 degrees from a phase of the second delay clock signal DCLK2 in response to the first phase control code CO[6:0] output from the phase controller 220. Accordingly, the clock delay circuit 210 may generate a phase-adjusted first delay clock signal DCLK1.

For example, in the example shown in FIG. 6A, at a time T1, a difference between the phase of the first delay clock signal DCLK1' and the phase of the second delay clock signal DCLK2 is not 180 degrees. However, at a time T3, a difference between the phase of a phase-adjusted first delay clock signal DCLK1 and the phase of the second delay clock signal DCLK2 is 180 degrees.

For example, the phase controller 220 may generate the first phase control code CO[6:0] for adjusting the phase of the first delay clock signal DCLK1' until the difference between the phase of the first delay clock signal DCLK1 and the phase of the second delay clock signal DCLK2 is 180 degrees.

Referring to FIGS. 1 to 5, and 6B, the phase controller 220 may generate the first phase control code CO[6:0] using the first delay clock signal DCLK1' before a phase adjustment which is output from the clock delay circuit 210 and the second delay clock signal DCLK2. The first delay cell chain 211 may increase a phase delay of the first delay clock signal DCLK1 so that the difference between the phase of the second delay clock signal DCLK2 and the first delay clock signal DCLK1 is 180 degrees, based on the first phase control code CO[6:0].

At each of the time T1 to T5, that is, when the first delay clock signal DCLK1' sampled at a rising edge of the second delay clock signal DCLK2 is logic 0, the phase controller 220 may generate the first phase control code CO[6:0] for adjusting the phase of the first delay clock signal DCLK1' as much as a second difference D2. The clock delay circuit 210 may adjust the phase of the first delay clock signal DCLK1' so as to have a difference of 180 degrees from the phase of the second delay clock signal DCLK2 in response to the first phase control code CO[6:0]output from the phase controller 220. Accordingly, the clock delay circuit 210 may generate a phase-adjusted first delay clock signal DCLK1.

For example, the phase controller 220 may generate the first phase control code CO[6:0] for adjusting the phase of the first delay clock signal DCLK1' until a difference between the phase of the first delay clock signal DCLK1 and the phase of the second delay clock signal DCLK2 is 180 degrees.

Figure 8:
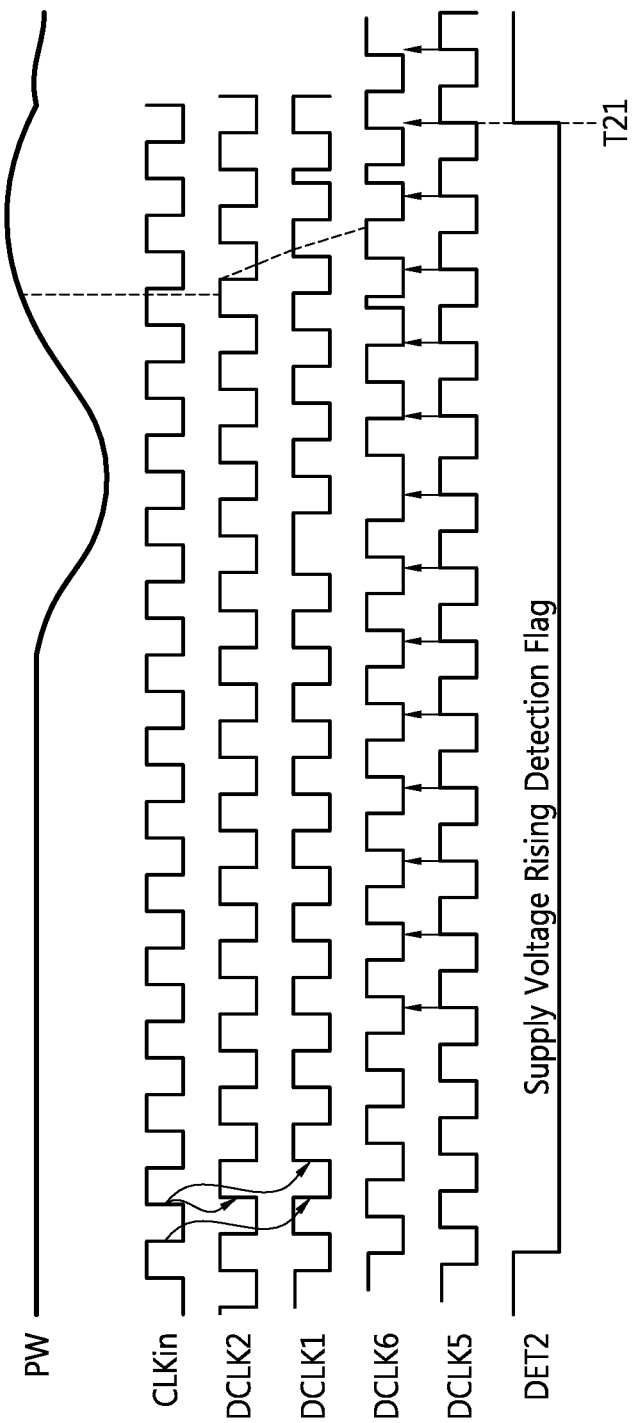
FIG. 8 is a timing diagram which describes an operation of a second detection circuit shown in FIG. 2.

FIG. 7 is a timing diagram which describes an operation of a first detection circuit shown in FIG. 2, and FIG. 8 is a timing diagram which describes an operation of a second detection circuit shown in FIG. 2.

A phase of the second delay clock signal DCLK2 may be delayed more than a phase of the clock signal CLKin by an offset delay of each of the second delay cells DL21 to DL27. For example, the offset delay may be generated by a multiplexer included in each of the second delay cells DL21 to DL27.

Based on the first phase control code CO[6:0] output from the up/down counter 223, a difference between a phase of the first delay clock signal DCLK1 and a phase of the second delay clock signal DCLK2 may be 180 degrees.

Referring to FIG. 7, the first detection circuit 230-1 may detect whether or not a supply voltage PW falls based on a difference between a third phase of the third delay clock signal DCLK3 and a fourth phase of the fourth delay clock signal DCLK4.

A phase of the third delay clock signal DCLK3 may be delayed more than a phase of the first delay clock signal DCLK1 by an offset delay of each of the third delay cells DL31 to DL34. The offset delay may be generated by a multiplexer included in each of the third delay cells DL31 to DL34.

A phase of the fourth delay clock signal DCLK4 may be delayed more than a phase of the second delay clock signal DCLK2 according to a delay of each of the delay cells DL41 to DL44 determined according to the fourth phase control code DV4[3:0] and an offset delay of each of the fourth delay cells DL41 to DL44.

Referring to FIG. 7, since the third delay clock signal DCLK3 sampled at each rising edge of the fourth delay clock signal DCLK4 before a first time T11 is logic 0, the first detection circuit 230-1 may output a first detection signal DET1 having logic 0 which indicates the supply voltage PW did not fall (or the supply voltage is maintained in a given range) according to a result of the sampling.

Since the third delay clock signal DCLK3 sampled at each of a first time T11 and a second time T12, that is, at each rising edge of the fourth delay clock signal DCLK4, is logic 1, the first detection circuit 230-1 may output a first detection signal DET1 having logic 1 which indicates the supply voltage PW fell from the first time T11 to the second time T12 according to a result of the sampling.

The third delay clock signal DCLK3 sampled at a third time T13, that is, at a rising edge of the fourth delay clock signal DCLK4, is logic 0, the first detection circuit 235-1 may output a first detection signal DET1 which changes from logic 1 to logic 0 according to a result of the sampling.

According to at least some example embodiments of the inventive concepts, the first detection signal DET1 serves as supply voltage falling detection flag, and has a level that varies according to a level of the third delay clock signal DCLK3 sampled at a sampling edge (e.g., a rising edge or a falling edge) of the fourth delay clock signal DCLK4. Using the first detection signal DET1 having logic 1, the detection circuit 230 may detect that the supply voltage PW falls lower than a set range. For example, the set range may be determined according to the fourth phase control code DV4[3:0].

Referring to FIG. 8, the second detection circuit 230-2 may detect whether or not the supply voltage PW rises based on a difference between a fifth phase of the fifth delay clock signal DCLK5 and a sixth phase of the sixth delay clock signal DCLK6.

A phase of the fifth delay clock signal DCLK5 may be delayed more than a phase of the first delay clock signal DCLK according to a delay of each of the delay cells DL51 to DL54 determined according to a fifth phase control code DV5[3:0] and an offset delay of each of the fifth delay cells DL51 to DL54.

A phase of the sixth delay clock signal DCLK6 may be delayed more than a phase of the second delay clock signal DCLK2 according to an offset delay of each of the sixth delay cells DL61 to DL64. For example, the offset delay may be generated by a multiplexer included in each of the sixth delay cells DL61 to DL64.

Referring to FIG. 8, since the sixth delay clock signal DCLK6 sampled at each rising edge of the fifth delay clock signal DCLK5 is logic 0 before a first time T21, the second detection circuit 230-2 may output a second detection signal DET2 having logic 0 which indicates that the supply voltage PW did not rise (or the supply voltage is maintained in a given range) according to a result of the sampling.

Since the sixth delay clock signal DCLK6 sampled at each rising edge of the fifth delay clock signal DCLK5 is logic 1 from the first time T21, the second detection circuit 230-2 may output a second detection signal DET2 having logic 1 which indicates that the supply voltage PW rose according to a result of the sampling.

According to at least some example embodiments of the inventive concepts, the second detection signal DET2 serves as a supply voltage rising detection flag, and has a level that varies according to a level of the sixth delay clock signal DCLK6 sampled at a sampling edge (e.g., a rising edge or a falling edge) of the fifth delay clock signal DCLK5. Using a first detection signal DET1 having logic 1, the detection circuit 230 may detect that the supply voltage PW rises higher than a set range. At this time, the set range may be determined according to the fifth phase control code DV5 [3:0].

Figure 9:
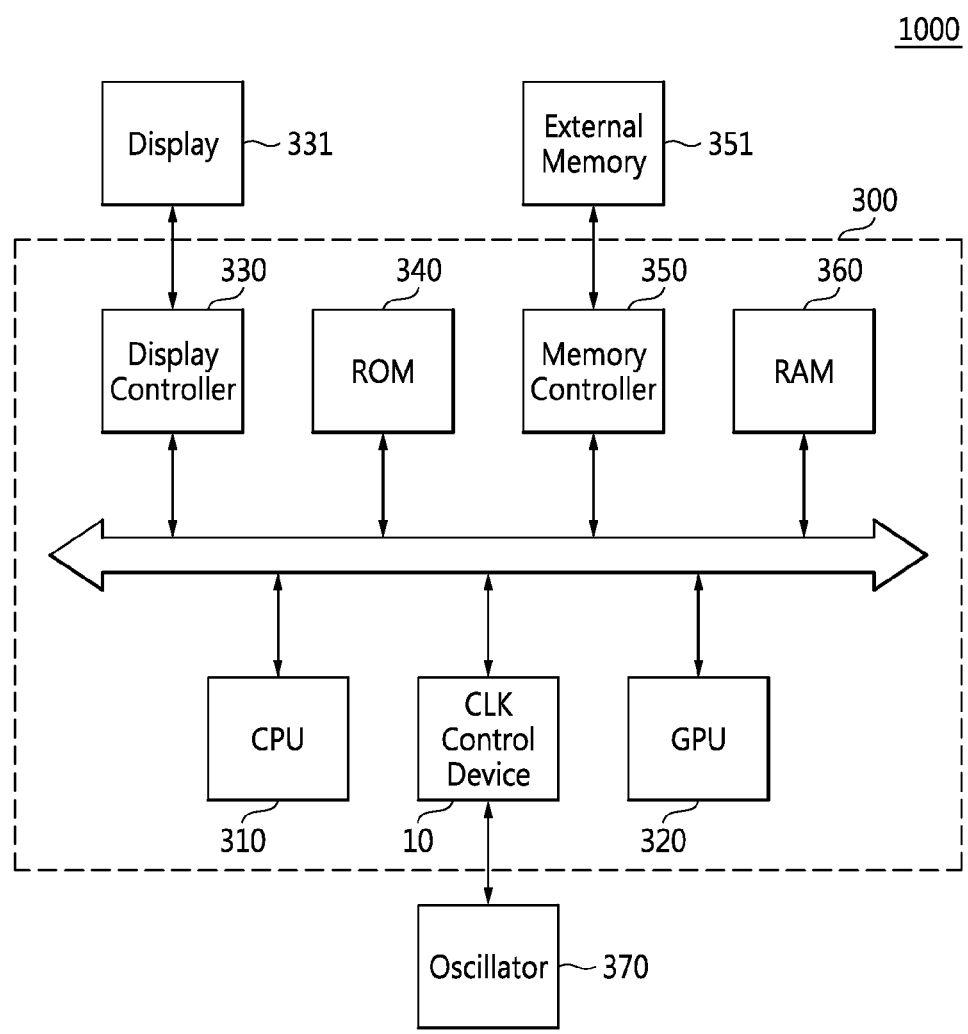
FIG. 9 is a schematic block diagram of a computing device which includes a clock control device shown in FIG. 1.

FIG. 9 is a schematic block diagram of a computing device including a clock control device shown in FIG. 1. A computing device 1000 may be embodied in an electronic device using a clock signal CLKin, e.g., a personal computer (PC) or a mobile computing device.

The computing device 1000 may include a controller 300, a display 331, an external memory 351, and an oscillator 370.

The controller 300 may be an integrated circuit, a SoC, an application processor (AP), or a chipset. The controller 300 may generally control an operation of the computing device 1000.

The controller 300 may include a clock control device 10, a CPU 310, a GPU 320, a display controller 330, a non-volatile memory device such as a read only memory (ROM) 340, a memory controller 350, a volatile memory device such as a random access memory (RAM) 160, and a bus. At this time, the clock control device 10 may be a clock control device 10 described referring to FIGS. 1 to 8.

The CPU 310 may process or execute programs and/or data stored in a memory 340, 360, or 351. For example, the CPU 310 may process or execute the programs and/or the data in response to a clock signal CLKout output from the clock control device 10.

The CPU 310 may be embodied in a multi-core processor. The multi-core processor is a computing component which includes two or more independent substantial processors (also referred to as cores), and each of the processors may read and execute program instructions.

The GPU 320 may reduce a load of the CPU 310, and read and execute program instructions related to graphics processing. The GPU 320 may receive data output from the memory 340, 360, or 351 or transmit data processed by the GPU 320 to the memory 340, 360, or 351 through a memory interface (not shown). The GPU 320 may process or execute the programs and/or the data in response to a clock signal CLKout output from the clock control device 10.

The programs and/or data stored in the memory 340, 360, or 351 may be loaded onto a memory embodied in the CPU 310 or the GPU 320.

The display controller 330 may control an operation of the display 331. The display 331 may display image data output from the display controller 330. For example, the display 331 may be embodied in a liquid crystal display (LCD), a light emitting diode (LED) display, an organic LED (OLED) display, an active-matrix OLED (AMOLED) display, or a flexible display.

The ROM 340 may store permanent programs and/or data. The ROM 340 may be embodied in an erasable programmable read-only memory (EPROM) or an electrically erasable programmable read-only memory (EE-PROM).

The memory controller 350 interfaces with an external memory 351. The memory controller 350 may generally control an operation of the external memory 351, and may control data exchange between the controller 300 and the external memory 351. For example, the memory controller 350 may write data in the external memory 351 or read data from the external memory 351 according to a request of the controller 300.

The external memory 351 may store an operation system (OS), various types of programs, and/or various types of data as a storage medium for storing data. The external memory 351 may be a volatile memory such as a DRAM and/or a non-volatile memory such as a NAND flash memory.

The RAM 360 may temporarily store programs, data, or instructions. For example, programs and/or data stored in the external memory 351 may be temporarily stored in the RAM 360 according to a control of the CPU 310 or a booting code stored in the ROM 340. The RAM 360 may be embodied in a dynamic RAM (DRAM) or a static RAM (SRAM). The oscillator 370 may supply a clock signal to the clock control device 10.

Figure 10:
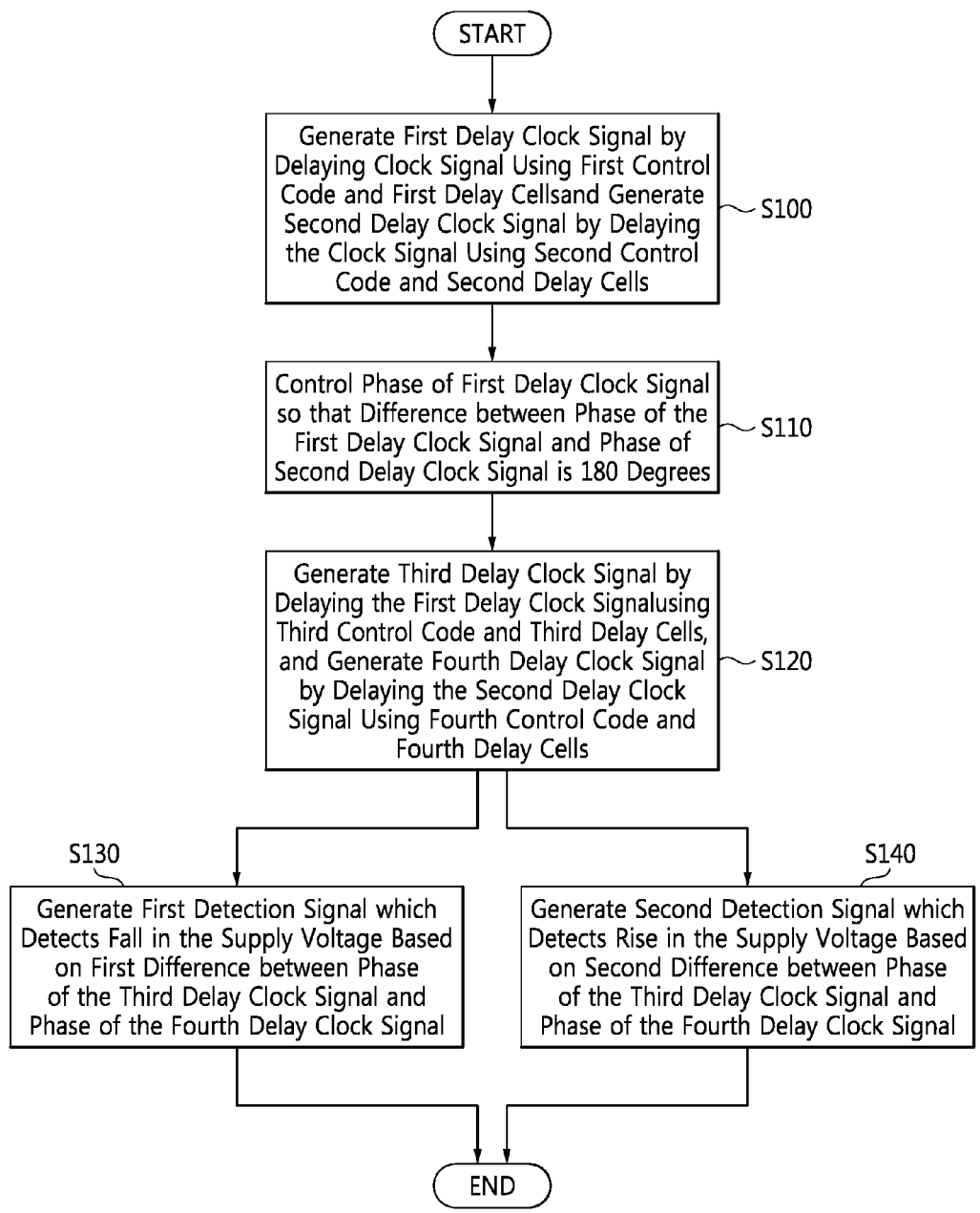
FIG. 10 is a flowchart which describes a method of operating the clock control circuit shown in FIG. 1.

FIG. 10 is a flowchart which describes a method of operating the clock control circuit shown in FIG. 1. Referring to FIGS. 1 to 10, a clock control circuit 200, 200-1, or 200-2 (collectively "200") generates a first delay clock signal DCLK1 by delaying a clock signal CLKin using the first delay cells DL11 to DL17 and the first phase control code CO[6:0] for controlling whether or not to delay each of the first delay cells DL11 to DL17, and generate a second delay clock signal DCLK2 by delaying a clock signal CLKin using the second delay cells DL21 to DL27 and a second control code for controlling whether or not to delay each of the second delay cells DL21 to DL27 (S100).

The clock control circuit 200 may control the first phase so that a difference between a first phase of the first delay clock signal DCLK1 and a second phase of the second delay clock signal DCLK2 is 180 degrees (S110).

The clock control circuit 200 may delay the first delay clock signal DCLK1 and generate a third delay clock signal DCLK3 or DCLK5 using the third delay cells DL31 to DL34 or DL51 to DL54 and a third control code for controlling whether or not to delay each of the third delay cells DL31 to DL34 or DL51 to DL54. The clock control circuit 200 may delay a second delay clock signal DCLK2 and generate a fourth delay clock signal DCLK4 or DCLK6 using fourth delay cells DL41 to DL44 or DL61 to DL64 and a fourth control code for controlling whether or not to delay each of the fourth delay cells DL41 to DL44 or DL61 to DL64.

According to at least one example embodiment, the clock control circuit 200 may detect a fall in a supply voltage PW based on a first difference between a third phase of the third delay clock signal DCLK3 and a fourth phase of the fourth delay clock signal DCLK4, and generate a first detection signal DET1 corresponding to a result of the detection (S130). According to at least one example embodiment, the clock control circuit 200 may detect a rise in the supply voltage PW based on a second difference between a third phase of the third delay clock signal DCLK5 and a fourth phase of the fourth delay clock signal DCLK6, and generate a second detection signal DET2 corresponding to a result of the detection (S140).

Figure 11:
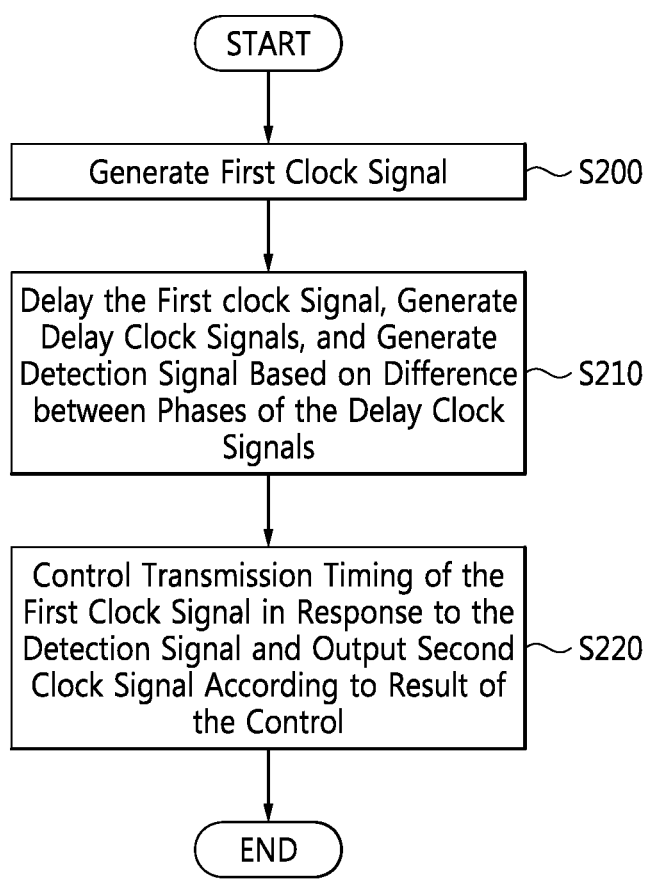
FIG. 11 is a flowchart which describes a method of operating the clock control device shown in FIG. 1.

FIG. 11 is a flowchart which describes a method of operating the clock control device shown in FIG. 1. Referring to FIGS. 1 to 11, the clock control device 10 may generate a first clock signal CLKin using the clock generator 100 (S200). The clock control device 10 may delay a first clock signal CLKin, generate delay clock signals DCLK1 to DCLK6 and generate a detection signal DET1 or DET2 based on a difference between phases of two delay clock signals among the delay clock signals DCLK1 to DCLK6 (S210).

The clock control device 10 may control a transmission timing of a first clock signal CLKin in response to a detection signal DET1 or DET2, and output a second clock signal CLKout to the function block 140 according to a result of the control (S220). For example, the clock control device 10 may output the second clock signal CLKout including at least a portion of the first clock signal CLKin in response to the detection signal DET1 or DET2.

An integrated circuit according to at least one example embodiment of the inventive concepts may generate a detection signal which detects a variation in a supply voltage using a phase of a clock signal dependent on the variation in a supply voltage, and control a transmission timing of the clock signal in response to the detection signal.

An integrated circuit at least one example embodiment according to at least one example embodiment of the inventive concepts may detect a minute variation in the supply voltage for each clock cycle using a plurality of delay cells, and control the clock signal output from a clock generator using a result of the detection.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An integrated circuit configured to detect a variation in a supply voltage using a phase of an input clock signal dependent on the variation in the supply voltage, the integrated circuit comprising:
    a clock delay circuit including different delay cell chains, the clock delay circuit configured to delay the input clock signal output from a clock generator using the different delay cell chains and generate a first delay clock signal and a second delay clock signal; and
    a phase controller configured to control a first phase so that a difference between the first phase and a second phase is 180 degrees,
    the first phase being a phase of the first delay clock signal,
    the second phase being a phase of the second delay clock signal,
    the different delay cell chains including,
        a first delay cell chain configured to generate the first delay clock signal having the first phase by changing a phase of the input clock signal by a first amount, the first amount being set based on a first phase control code received by the first delay cell chain; and
        a second delay cell chain configured to generate the second delay clock signal having the second phase by changing a phase of the input clock signal by a second amount, the second amount being set based on a set value and not based on the first phase control code.

2. The integrated circuit of claim 1, wherein the phase controller includes:
    a comparison signal generator configured to sample the first delay clock signal using the second delay clock signal, and generate a comparison signal according to a result of the sampling; and
    an up/down counter configured to generate the first phase control code for controlling the first phase based on the comparison signal and an inverted version of the input clock signal.

3. The integrated circuit of claim 2, wherein the up/down counter is configured to,
    determine whether to perform an up count operation or a down count operation according to a level of the comparison signal,
    perform a determined count operation using the inverted version of the input clock signal, and
    generate the first phase control code.

4. The integrated circuit of claim 2, further comprising:
    a detection circuit configured to generate a third delay clock signal by delaying the first delay clock signal, generate a fourth delay clock signal by delaying the second delay clock signal, and output a detection signal that indicates a variation direction of the supply voltage based on a difference between a third phase of the third delay clock signal and a fourth phase of the fourth delay clock signal.

5. The integrated circuit of claim 4, further comprising:
    a clock phase adjuster configured to generate a transmission control signal in response to the detection signal, wherein the clock generator controls a transmission timing of the input clock signal based on the transmission control signal.

6. The integrated circuit of claim 4, wherein the detection circuit samples the third delay clock signal using the fourth delay clock signal, and generates the detection signal which indicates that the supply voltage has fallen.

7. The integrated circuit of claim 6, wherein the detection circuit includes
    a third delay cell chain configured to delay a phase of the first delay clock signal based on a set value and generate the third delay clock signal having the third phase;
    a fourth delay cell chain configured to delay a phase of the second delay clock signal based on a second phase control code and generate the fourth delay clock signal having the fourth phase; and
    a detection signal generator configured to sample the third delay clock signal using the fourth delay clock signal and generate the detection signal.

8. The integrated circuit of claim 4, wherein the detection circuit samples the fourth delay clock signal using the third delay clock signal, and generates the detection signal which indicates that the supply voltage has risen.

9. The integrated circuit of claim 8, further comprising:
    a third delay cell chain configured to delay a phase of the first delay clock signal based on a second phase control code and generate the third delay clock signal having the third phase;
    a fourth delay cell chain configured to delay a phase of the second delay clock signal based on a set value and generate the fourth delay clock signal having the fourth phase; and
    a detection signal generator configured to sample the fourth delay clock signal using the third delay clock signal and generate the detection signal.

10. The integrated circuit of claim 2, further comprising:
    a third delay cell chain configured to delay the first delay clock signal based on a set value and generate a third delay clock signal;
    a fourth delay cell chain configured to delay a phase of the second delay clock signal based on a second phase control code and generate a fourth delay clock signal;
    a fifth delay cell chain configured to delay a phase of the first delay clock signal based on the second phase control code and generate a fifth delay clock signal;
    a sixth delay cell chain configured to delay the second delay clock signal based on a set value and generate a sixth delay clock signal;

a first detection signal generator configured to sample the third delay clock signal using the fourth delay clock signal and generate a first detection signal that indicates the supply voltage has fallen; and
a second detection signal generator configured to sample the sixth delay clock signal using the fifth delay clock signal and generate a second detection signal that indicates the supply voltage has risen.

11. The integrated circuit of claim 10, further comprising:
a clock phase adjuster configured to generate a transmission control signal in response to the first detection signal or the second detection signal, wherein the clock generator controls a transmission timing of the input clock signal based on the transmission control signal.

12. A computing device comprising:
a power management integrated circuit (IC); and
an integrated circuit configured to detect a variation in a supply voltage using a phase of an input clock signal dependent on the variation in a supply voltage PW output from the power management IC,
wherein the integrated circuit includes,
  a clock generator configured to generate the input clock signal;
  a clock delay circuit including different delay cell chains, the clock delay circuit configured to delay the input clock signal output from the clock generator using the different delay cell chains and generate a first delay clock signal and a second delay clock signal; and
  a phase controller configured to control a first phase so that a difference between the first phase and a second phase is 180 degrees,
  the first phase being a phase of the first delay clock signal,
  the second phase being a phase of the second delay clock signal,
  the different delay cell chains including,
    a first delay cell chain configured to generate the first delay clock signal having the first phase by changing a phase of the input clock signal based on a first phase control code and; and
    a second delay cell chain configured to generate the second delay clock signal having the second phase by changing a phase of the input clock signal based on a set value and not based on the first phase control code.

13. The computing device of claim 12, wherein the phase controller includes
a comparison signal generator configured to sample the first delay clock signal using the second delay clock signal and generate a comparison signal according to a result of the sampling; and
an up/down counter configured to generate the first phase control code for controlling the first phase based on the comparison signal and an inverted version of the input clock signal.

14. The computing device of claim 13, wherein, the up/down counter is configured to,
determine whether to perform an up count operation or a down count operation according to a level of the comparison signal,
perform a determined count operation using the inverted version of the input clock signal, and
generate the first phase control code.

15. A computing device comprising:
a clock signal control circuit configured to output an output clock signal; and
a function circuit configured to operate based on the output clock signal,
the clock signal control circuit being further configured to,
  generate an input clock signal,
  generate a first delay clock signal having a first phase by delaying the input clock signal by a first amount, the first amount being set based on a first phase control code,
  generate a second delay clock signal having a second phase by delaying the input clock signal,
  generate a third delay clock signal having a third phase by delaying the first delay clock signal,
  generate a fourth delay clock signal having a fourth phase by delaying the second delay clock signal,
  generate a comparison signal by sampling the first delay clock signal using the second delay clock signal,
  generate the first phase control code based on the comparison signal,
  generate a first detection signal by sampling the third delay clock signal based on the fourth delay clock signal, the first detection signal indicating whether or not a supply voltage of the clock signal control circuit has fallen,
  generate a first adjusted clock signal by adjusting the input clock signal based on the first detection signal indicating the supply voltage has fallen, and
  output to the function circuit, as the output clock signal, the first adjusted clock signal.

16. The computing device of claim 15, wherein the clock signal control circuit is configured to generate the first delay clock signal and the second delay clock signal such that a phase difference between the first phase and the second phase is 180°.

17. The computing device of claim 15, wherein the output clock signal controls a timing of operations of the function circuit.

18. The computing device of claim 15, wherein the clock signal control circuit is configured to,
generate a fifth delay clock signal having a fifth phase by delaying the first delay clock signal,
generate a sixth delay clock signal having a sixth phase by delaying the second delay clock signal,
generate a second detection signal by sampling the sixth delay clock signal based on the fifth delay clock signal, the second detection signal indicating whether or not a supply voltage of the clock signal control circuit has risen,
generate a second adjusted input clock signal by adjusting the input clock signal based on the second detection signal indicating the supply voltage has risen, and
output to the function circuit, as the output clock signal, the second adjusted input clock signal.

19. The computing device of claim 18, wherein the clock signal control circuit is configured to generate the first delay clock signal and the second delay clock signal such that a phase difference between the first phase and the second phase is 180°.

* * * * *